United States Patent
Chuang et al.

(10) Patent No.: US 9,510,462 B2
(45) Date of Patent: Nov. 29, 2016

(54) METHOD FOR FABRICATING CIRCUIT BOARD STRUCTURE

(71) Applicant: Quanta Computer Inc., Kuei Shan Hsiang, Tao Yuan Shien (TW)

(72) Inventors: Tung-Lin Chuang, Tao Yuan Shien (TW); Chi-Yi Yen, Tao Yuan Shien (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 250 days.

(21) Appl. No.: 14/565,738

(22) Filed: Dec. 10, 2014

(65) Prior Publication Data

US 2016/0066436 A1    Mar. 3, 2016

(30) Foreign Application Priority Data

Sep. 1, 2014   (TW) .............................. 103130070 A

(51) Int. Cl.
H05K 3/36    (2006.01)
B23K 1/00    (2006.01)
H05K 1/14    (2006.01)
H05K 3/34    (2006.01)

(52) U.S. Cl.
CPC ............. *H05K 3/368* (2013.01); *B23K 1/0008* (2013.01); *H05K 1/141* (2013.01); *H05K 3/3436* (2013.01); *H05K 2203/041* (2013.01)

(58) Field of Classification Search
CPC .. B23K 1/0008; H05K 1/141; H05K 3/3436; H05K 3/368; H05K 2203/041
See application file for complete search history.

(56) References Cited

U.S. PATENT DOCUMENTS

| | | | | |
|---|---|---|---|---|
| 5,191,404 A | * | 3/1993 | Wu ..................... | H01L 23/5385 257/723 |
| 5,208,729 A | * | 5/1993 | Cipolla ................. | H01L 23/467 165/80.3 |
| 5,252,916 A | * | 10/1993 | Swart ................. | G01R 1/07307 324/754.15 |
| 5,335,146 A | * | 8/1994 | Stucke ................. | H05K 7/1445 174/260 |
| 6,801,440 B2 | * | 10/2004 | Inoue ..................... | H05K 1/141 257/686 |
| 7,033,861 B1 | * | 4/2006 | Partridge .............. | H01L 25/105 257/E21.705 |
| 7,041,516 B2 | * | 5/2006 | Rajagopalan .......... | H01L 22/20 257/E21.525 |
| 7,595,550 B2 | * | 9/2009 | Cady ................... | H01L 23/3114 257/685 |
| 2014/0117538 A1 | | 5/2014 | Chen et al. | |

FOREIGN PATENT DOCUMENTS

TW   201417235     5/2014
WO    80/01628   *  8/1980

OTHER PUBLICATIONS

Chinese language office action dated Dec. 28, 2015, issued in application No. TW 103130070.

* cited by examiner

*Primary Examiner* — Carl Arbes
(74) *Attorney, Agent, or Firm* — McClure, Qualey & Rodack, LLP

(57) ABSTRACT

A method for fabricating a circuit board structure is provided. The method includes providing a first circuit board and a second circuit board, wherein the area of the second circuit board is less than the area of the first circuit board. The first circuit board and the second circuit board are combined by a surface mount technology to form the circuit board structure having a portion with a different number of layers.

10 Claims, 4 Drawing Sheets

METHOD FOR FABRICATING CIRCUIT BOARD STRUCTURE

CROSS REFERENCE TO RELATED APPLICATIONS

The present application claims priority of Taiwan Patent Application No. 103130070, filed on Sep. 1, 2014, the entirety of which is incorporated by reference herein.

BACKGROUND OF THE DISCLOSURE

Field of the Disclosure

The present disclosure relates to a method for fabricating a circuit board structure, which can reduce the fabrication cost.

Description of the Related Art

A circuit board is mainly used to mechanically support and electrically connect electronic components, and thus is an essential component in electronic products.

FIG. 1A is a schematic top view of a conventional circuit board structure, in which the conventional circuit board may be a motherboard with a processor 10, a memory, 12, a power 14, I/O connectors 16, active and passive components, and conductive wires (not shown in FIG. 1A) disposed thereon. It should be realized that the electronic components such as the processor 10, the memory 12, and the power 14 and so on usually have complex circuit layouts, and therefore need to be supported by a multilayer circuit board (such as 8 layers, 10 layers, or more layers in the circuit board). However, a single circuit board only has a specific number of layers, thus resulting in the entire circuit board (comprising an area A where the processor 10, the memory 12, and the power 14 are located, and an area B, outside the area A, where the I/O connectors 16 and other active and passive components are located) should be fabricated by a multilayer (such as 8 layers, 10 layers, or more layers) process, such that the fabrication cost is increased.

To solve this problem, a known method utilizing a separated main board and small boards is used (FIG. 1B), wherein the electronic components like the processor 10, the memory 12, and the power 14 are mounted on a main board A fabricated by the multilayer process, and the I/O connectors 16 and other active and passive components are mounted on other small boards B1~B3 having less than four layers. Also, the main board A and the small boards B1~B3 are connected with each other by various cables. However, this method can reduce the fabrication cost of a large-area multilayer circuit board, but it also increases other additional costs, such as cables, cable connectors, and assembly costs. Moreover, the use of cables can easily cause some derivative problems, such as signal attenuation and electromagnetic interference (EMI).

BRIEF SUMMARY OF THE DISCLOSURE

In view of the known problems cited above, an object of the disclosure is to provide a method for fabricating a circuit board structure, which can satisfy the requirement that the circuit board structure have at least one portion with a different number of layers, and that it can effectively reduce the fabrication cost. Moreover, the method can also prevent the use of cables, thus reducing the problems of signal attenuation and electromagnetic interference (EMI).

An embodiment of the disclosure provides a method for fabricating a circuit board structure. The method comprises providing a first circuit board; providing a second circuit board, wherein the area of the second circuit board is less than the area of the first circuit board; and combining the first circuit board with the second circuit board by a surface mount technology (SMT) to form the circuit board structure having a portion with a different number of layers.

In another embodiment, the method further comprises mounting a plurality of electronic components on the second circuit board.

In another embodiment, wherein the plurality of electronic components include a processor, memory, power, or a combination thereof.

In another embodiment, wherein the plurality of electronic components are arranged in close order on the second circuit board, so as to reduce the area of the second circuit board.

In another embodiment, wherein the number of layers of the second circuit board is greater than the number of layers of the first circuit board.

In another embodiment, wherein the plurality of electronic components are mounted on the second circuit board by a surface mount technology.

In another embodiment, wherein the surface mount technology comprises electrically connecting the plurality of electronic components with the second circuit board through a plurality of solder balls by welding.

In another embodiment, wherein the surface mount technology comprises electrically connecting the first circuit board with the second circuit board through a plurality of solder balls by welding.

In another embodiment, wherein the first circuit board is a printed circuit board.

In another embodiment, wherein the second circuit board is a printed circuit board.

BRIEF DESCRIPTION OF THE DRAWINGS

The disclosure can be more fully understood by reading the subsequent detailed description and examples with references made to the accompanying drawings, wherein.

DETAILED DESCRIPTION OF THE DISCLOSURE

In order to illustrate the purposes, features and advantages of the disclosure, the embodiments and figures of the disclosure are shown in detail as follows.

Figure 2:
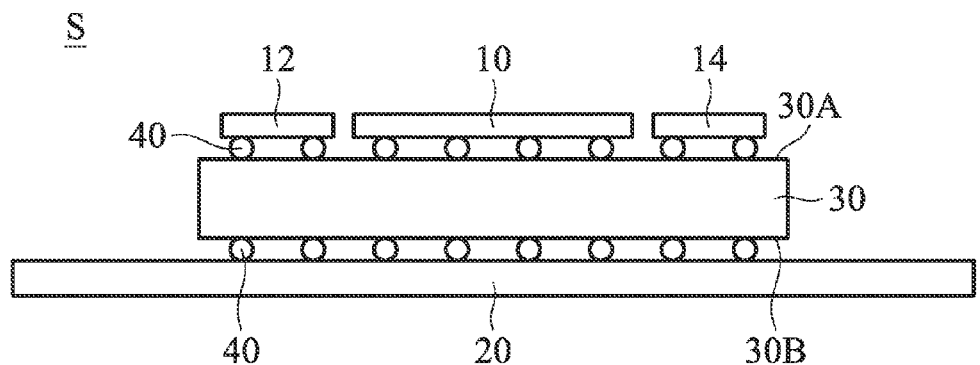
FIG. 2 is a schematic cross-sectional view of a circuit board assembly in accordance with an embodiment of the disclosure.

FIG. 2 is a schematic cross-sectional view of a circuit board assembly in accordance with an embodiment of the disclosure, in which the circuit board assembly S may be a motherboard, mainly including a processor 10, a memory 12, a power 14 used by the processor 10 and the memory 12, a first circuit board 20, a second circuit board 30, and several solder balls 40.

In this embodiment, the processor 10, the memory 12, and the power 14 are disposed on the second circuit board 30 by a surface mount technology (SMT), i.e. the processor 10, the memory 12, and the power 14 are electrically connected with an upper surface 30A of the second circuit board 30 through the solder balls 40 by welding. The second circuit board 30 may be a printed circuit board (PCB) fabricated by a multilayer (such as 8 layers, 10 layers, or more layers) process. However, in some embodiments, the processor 10, the memory 12, and the power 14 may also be electrically connected with the second circuit board 30 through silver adhesive or conductive glue. Alternatively, the second circuit board 30 may be a flexible printed circuit (FPC).

Moreover, the first circuit board 20 may be a PCB having less than six or four layers, on which some active and passive components and connectors (not shown in FIG. 2) are mounted. The first circuit board 20 and the second circuit board 30 are also electrically connected with each other through the solder balls 40 by an SMT. In some embodiments, the first circuit board 20 and the second circuit board 30 may also be electrically connected with each other through silver adhesive or conductive glue. Alternatively, the first circuit board 20 may be an FPC.

Figure 1A:
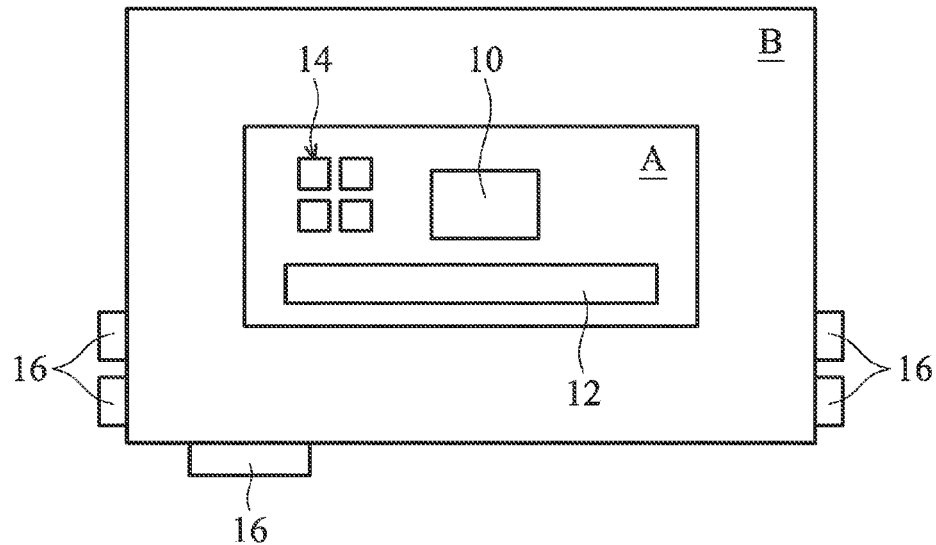
FIG. 1A and FIG. 1B are schematic top views of conventional circuit board structures.
Figure 1B:
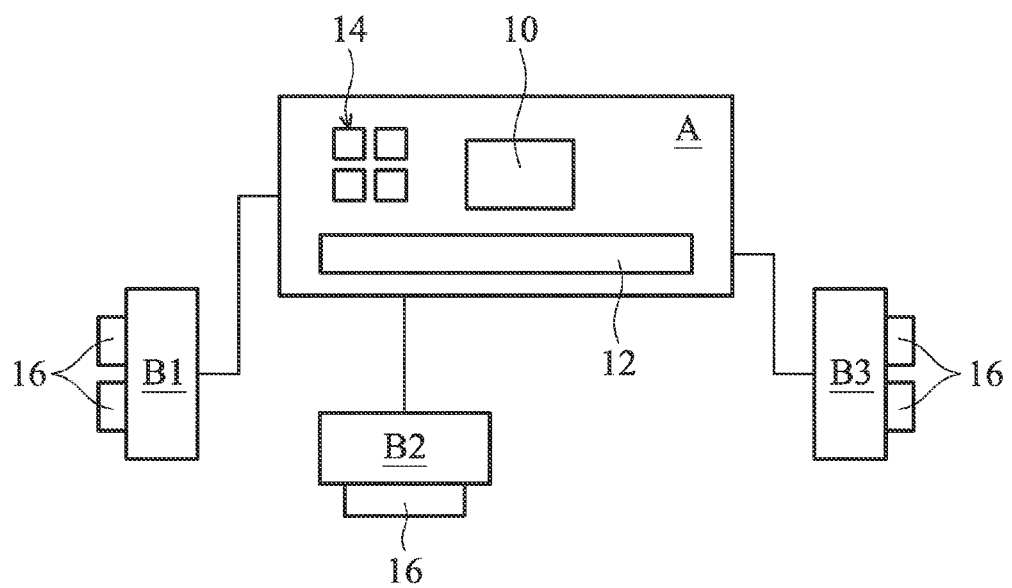

In this embodiment, since only the electronic components such as the processor 10, the memory 12, and the power 14 and so on having the requirement of multiple layers are mounted on an individual second circuit board 30 (with multiple layers), and the area of the second circuit board 30 is less than the area of the first circuit board 20, the fabrication cost of a multilayer circuit board structure (i.e. the circuit board assembly S) can be effectively reduced. Moreover, the arrangement of the electronic components such as the processor 10, the memory 12, and the power 14 on the upper surface 30A of the second circuit board 30 may be similar to the arrangement of the area A of the circuit board structure in FIG. 1A, and preferably, those electronic components are arranged in close order on the second circuit board 30, so as to reduce the area of the second circuit board 30. Thus, the fabrication cost can be further reduced. The electronic components supported by the second circuit board 30 are not limited to the processor 10, the memory 12, the power 14, or a combination thereof, but may also include other electronic components with complex circuit layouts.

Additionally, the first circuit board 20 and the second circuit board 30 of this embodiment are electrically connected with each other by an SMT, thus preventing the use of cables, so that the problems of signal attenuation and EMI are reduced. Also, the requirement of a circuit board structure having at least one portion with a different number of layers can be met.

Though the number of layers of the second circuit board 30 is greater than the number of layers of the first circuit board 20 in the embodiment as described above, the disclosure is not so limited. In some embodiments, the second circuit board 30 may also have a number of layers that is equal to or less than that of the first circuit board 20, and the circuit layouts of the processor 10, the memory 12, and the power 14 etc. can be shared in the layers of the second circuit board 30 and the first circuit board 20.

Figure 3:
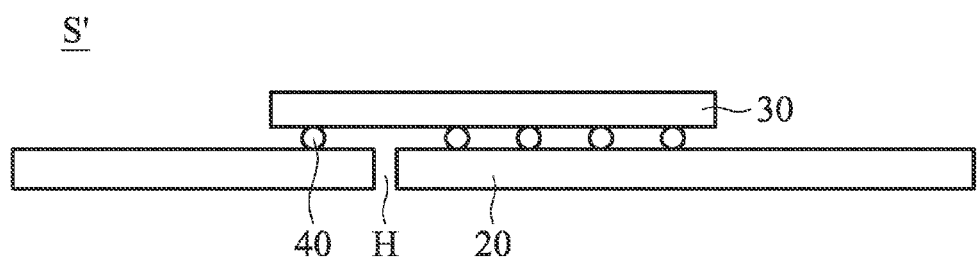
FIG. 3 is a schematic cross-sectional view of a circuit board assembly in accordance with another embodiment of the disclosure.

FIG. 3 is a schematic cross-sectional view of a circuit board assembly in accordance with another embodiment of the disclosure, in which the circuit board assembly S' may be a display card, mainly including a first circuit board 20, a second circuit board 30, and a plurality of solder balls 40.

In this embodiment, both the first circuit board 20 and the second circuit board 30 are PCBs having less than six or four layers. The first circuit board 20 includes several active and passive components and connectors (not shown in FIG. 3) disposed thereon. The second circuit board 30 does not support any electronic component with complex circuit layout. In addition, the number of layers of the first circuit board 20 is greater than the number of layers of the second circuit board 30.

As shown in FIG. 3, the first circuit board 20 and the second circuit board 30 are electrically connected with each other through the solder balls 40 by the SMT. In some embodiments, the first circuit board 20 and/or the second circuit board 30 may also be FPCs electrically connected with each other through silver adhesive or conductive glue.

Note that the second circuit board 30 of this embodiment is mainly used as an expanded (small) board of the first circuit board 20, so as to provide an additional space for circuit layouts. Accordingly, some conductive wires can form a bridge connection through the second circuit board 30, thus avoiding a through hole H on the first circuit board 20 or some locations of the first circuit board 20 where electronic components are mounted. Also, the second circuit board 30 can have a great ability to load large currents.

Figure 4A:
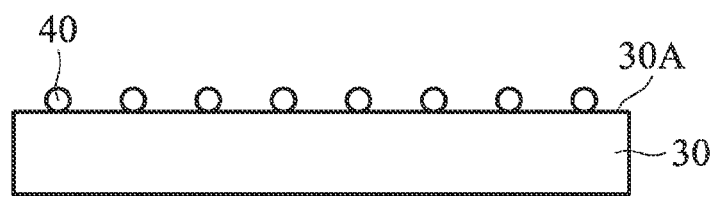
FIGS. 4A~4D are schematic cross-sectional views of intermediate stages of the fabrication of the circuit board assembly in FIG. 2 in accordance with an embodiment of the disclosure.

Referring to FIGS. 4A to 4D, which are schematic cross-sectional views of intermediate stages of the fabrication of the circuit board assembly S in FIG. 2 in accordance with an embodiment of the disclosure. As shown in FIG. 4A, a second circuit board 30 is provided first, wherein the second circuit board 30 may be a PCB fabricated by a multilayer (such as 8 layers, 10 layers, or more layers) process. Then, a plurality of solder balls 40 are applied to the weld pads on the upper surface 30A of the second circuit board 30 through a printing process.

Figure 4B:
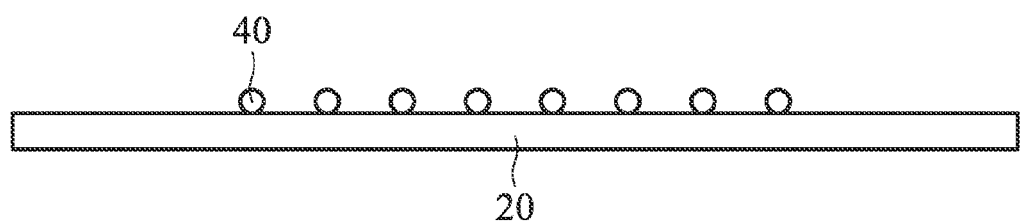

As shown in FIG. 4B, a first circuit board 20 is provided, wherein the first circuit board 20 may be a PCB having less than six or four layers. Then, similarly, a plurality of solder balls 40 are applied to the weld pads on the first circuit board 20 through a printing process.

Figure 4C:
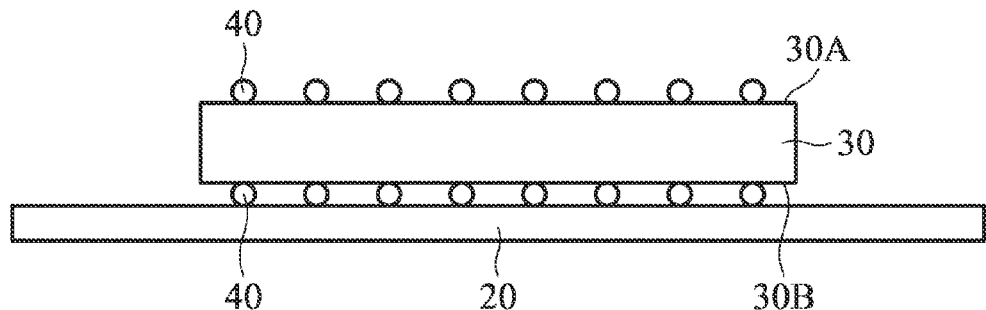

As shown in FIG. 4C, the second circuit board 30 is mounted on the first circuit board 20 with the external signal terminals and the ground terminals (proving a great reference loop for high-speed signals, so as to reduce the problems of EMI and signal attenuation) on a lower surface 30B of the second circuit board 30 aligned with the solder balls 400 on the first circuit board 20. It should be realized that the second circuit board 30 is regarded as a surface mount device (SMD) in this placement process, which can be performed by any suitable mounter known in the field of circuit board fabrication.

Figure 4D:
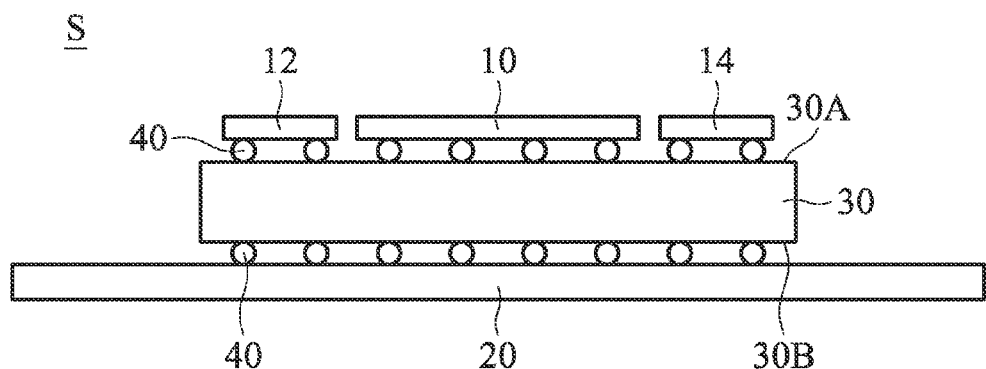

As shown in FIG. 4D, the electronic components such as the processor 10, the memory 12, and the power 14 and so on (also regarded as SMDs) are mounted on the second circuit board 30 with the electrical contacts aligned with the solder balls 40 on the upper surface 30A of the second circuit board 30. Next, a reflow process is performed and the welded connections between the processor 10, the memory 12, the power 14, the first circuit board 20, and the second circuit board 30 can be achieved, such that the fabrication of the circuit board assembly S is completed.

As mentioned above, the disclosure provides a method for fabricating a circuit board structure. The method combines two circuit boards through the SMT, thus satisfying the requirement that the circuit board structure have at least one portion with a different number of layers (for example, the requirement is due to the circuit board structure mounted with some electronic components having complex circuit layouts or needing an additional space for circuit layouts), and preventing the use of cables, so as to reduce the problems of signal attenuation and EMI. Moreover, with the close arrangement of electronic components and the circuit layouts design, the area of the second circuit board (expanded board) can be also lessened, such that the fabrication cost is effectively reduced.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a circuit board structure, comprising:
    providing a first circuit board;
    providing a second circuit board, wherein an area of the second circuit board is less than an area of the first circuit board; and
    combining the first circuit board with the second circuit board by a surface mount technology to form the circuit board structure having a portion with a different number of layers.

2. The method as claimed in claim 1, further comprising:
    mounting a plurality of electronic components on the second circuit board.

3. The method as claimed in claim 2, wherein the plurality of electronic components include a processor, memory, power, or a combination thereof.

4. The method as claimed in claim 2, wherein the plurality of electronic components are arranged in close order on the second circuit board, so as to reduce the area of the second circuit board.

5. The method as claimed in claim 1, wherein a number of layers of the second circuit board is greater than a number of layers of the first circuit board.

6. The method as claimed in claim 2, wherein the plurality of electronic components are mounted on the second circuit board by a surface mount technology.

7. The method as claimed in claim 6, wherein the surface mount technology comprises electrically connecting the plurality of electronic components with the second circuit board through a plurality of solder balls by welding.

8. The method as claimed in claim 1, wherein the surface mount technology comprises electrically connecting the first circuit board with the second circuit board through a plurality of solder balls by welding.

9. The method as claimed in claim 1, wherein the first circuit board is a printed circuit board.

10. The method as claimed in claim 1, wherein the second circuit board is a printed circuit board.

* * * * *